(12) United States Patent
Chen

(10) Patent No.: US 6,298,312 B1
(45) Date of Patent: Oct. 2, 2001

(54) METHOD OF DETERMINING THE TIP ANGLE OF A PROBE CARD NEEDLE

(75) Inventor: Shu Min Chen, Hsin-Chu (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 09/120,810

(22) Filed: Jul. 22, 1998

(51) Int. Cl.[7] ........................................................ G01C 1/00
(52) U.S. Cl. .............................................. 702/151; 324/761
(58) Field of Search ..................................... 702/151, 154, 702/152, 153, 94, 95, 33, 150, 155, 167, 168; 324/758, 761, 762, 757, 765, 759; 250/306; 433/72; 700/195, 192; 33/503–505, 534

(56) References Cited

U.S. PATENT DOCUMENTS

| | | | |
|---|---|---|---|
| 4,719,417 | * 1/1988 | Evans | 324/158 |
| 4,780,836 | * 10/1988 | Miyazaki et al. | 702/117 |
| 4,864,227 | * 9/1989 | Sato | 324/158 |
| 5,091,692 | * 2/1992 | Ohno et al. | 324/158 |
| 5,642,056 | * 6/1997 | Nakjima et al. | 324/758 |
| 5,773,987 | * 6/1998 | Montoya | 324/757 |
| 5,861,759 | * 1/1999 | Bialobrodski et al. | 324/758 |
| 6,134,506 | * 10/2000 | Rosenberg et al. | 702/95 |

\* cited by examiner

Primary Examiner—Marc S. Hoff
Assistant Examiner—Edward Raymond
(74) Attorney, Agent, or Firm—Tung & Associates

(57) ABSTRACT

A method is provided for determining the tip angle of a probe needle used to measure electrical characteristics of a circuit device, such as an IC. The spatial coordinates ($X_1$, $Y_1$, $Z_1$), ($X_2$, $Y_1$, $Z_2$), ($X_3$, $Y_1$, $Z_3$), of three spaced apart locations A, B, C along the outer free end of the needle tip are measured. The slopes $m_1$, $m_2$ of two longitudinal sections of the needle determined, and the tip angle is then calculated using the slopes $m_1$, $m_2$.

6 Claims, 2 Drawing Sheets

METHOD OF DETERMINING THE TIP ANGLE OF A PROBE CARD NEEDLE

TECHNICAL FIELD

The present invention generally relates to methods for testing semi-conductor and IC (integrated circuit) devices, and deals more particularly with a method for measuring the tip angle of a semi-conductor probe needle forming part of a probe card used to perform electrical testing of the device.

BACKGROUND OF THE INVENTION

Many circuits and complex, multi-staged electronic systems that previously were regarded as economically unfeasible and practical, are now realizable using integrated circuits. The fabrication of a single-crystal monolithic circuit involves the formation of diodes, transistors, resisters and capacitors on a single microelectronic substrate. In practice, a microelectronic substrate for a semi-conductor IC's is formed on a silicon wafer, the patterns for circuit processing being applied to the wafer by photolithography. Each wafer contains the patterns of many identical integrated circuits. After the patterns are tested, the wafer is sliced into "dice," each die containing a single circuit.

In an integrated circuit pattern, the input, output, power supply and other terminals of the circuit are formed by metalized contacts, usually deployed along the periphery or margins of the pattern. The outline of the pattern is either square or rectangular, and the marginal locations of the contacts thereon depend on the circuit configuration and the available marginal space. Thus, in a relatively simple circuit pattern, all of the marginal space may be available for contacts, whereas in more complex circuits, portions of the circuit may invade the marginal areas so that contact placement is restricted to the free marginal areas. In some instances, therefore, the contacts may lie in more or less uniform rows along the margins, and in other cases, the contacts may be randomly spaced from each other.

Immediately following manufacture of the IC, the electrical characteristics of the device must be tested using a test probe assembly which includes a test probe card consisting of a printed circuit board having an opening therein to provide access to an IC pattern. The opening is surrounded by a ring of conductive pads connected by the printed circuit to card terminals for connection to test equipment appropriate for testing the circuit. The number of pads in the ring determines the maximum capicity of the probe card.

A higher degree of integration in recent semi-conductor devices has led to an increase in the number of electrodes in ICs, and to a decrease in the size of the electrode pads which are contacted by the probe needles. The reduction in size and increase in density of the probe needles has inevitably made the manufacture and mounting of the needles on the probe card troublesome. The tips of the probe needles are ideally all disposed at the same height level and same angle, but these, and other parameters of the needles fluctuate somewhat for a number of reasons. These variations in probe needle parameters reduce test precision and reliability. The following U.S. Patents disclose various probe card arrangements, as well as various techniques and methods for assuring proper alignment of the probe tip needles:

| U.S. Pat. No. | Issue Date |
| --- | --- |
| 4,780,836 | October 25, 1988 |
| 5,061,894 | October 29, 1991 |
| 5,642,056 | June 24, 1997 |
| 5,631,573 | May 20, 1997 |
| 5,521,518 | May 28, 1996 |

As will be discussed later in more detail, the effectiveness, reliability and repeatability of IC testing using a probe card depends on a number of factors and characteristics of the probe card, and particularly the probe needles, including size, alignment, leakage, contact resistance and the force applied by the needles. All of these factors are influenced to some degree by the angle of the probe tip. According to current industry standards, the ideal angle of the probe tip should be between 103 and 107 degrees, which will typically result in the application of a force between 1.5 and 2 grams per mil, when 3 mils of overtravel is provided. In the past, apparatus and methods have been devised for measuring the tip angle before the probe is assembled but no methods have been available for measuring tip angle after the probe card is assembled. Even after the probe card is assembled, the tip angle of one of more of the probe needles may be inadvertently altered during the sometimes complex set up of the test probe assembly. In those cases where tip angle has been altered so as to be out of tolerance, the out of tolerance probe needle may fail to make proper contact with a conductor pad on the IC, thus providing false or inaccurate testing, which in turn reduces production yield. In other cases, an out of tolerance probe tip angle may result in the application of too much or too little force on the conductor pad, which in turn results in over or under scrubbing of the pad. Where the pad is underscrubbed by the needle tip, no probe mark may be left on the pad, whereas too great a probe force results in a damaged bond pad.

Accordingly, there is a need in the art for a method of assuring proper probe tip angle on a probe card after the card is assembled, as well as a method for measuring the probe tip angle.

SUMMARY OF THE INVENTION

According to the present invention, a method is provided for determining the angle of a probe needle tip used in a probe assembly for measuring electrical characteristics of a circuit device, such as a IC, comprising the steps of: determining the slope of a first, end section of the tip; determining the slope of a second section of the tip adjacent to the first section; and, calculating the angle of the tip using the two determined slopes. The slopes are preferably determined by measuring the spatial positions of at least three spaced apart points along the length of the needle tip. The measurements are carried out by contacting the needle tip at first, second and third points using a measuring probe, such as that forming part of a coordinate measuring machine.

According to another aspect of the invention, a method of determining the angle of a probe needle tip used in a probe assembly for measuring electrical characteristics of a circuit device, comprises the steps of: measuring the spatial location of at least three spaced apart points along the length of the needle tip; and determining the angle using the locations along the tip that had been measured. The angle is determined using triangulation techniques, based on the measured spatial locations.

According to another aspect of the invention, a method of determining the angle of a probe needle tip used in a probe assembly employed for contacting and measuring electrical characteristics of a circuit device comprises the steps of: determining the spatial coordinates $(X_1, Y_1, Z_1)$, $(X_2, Y_1, Z_2)$, $(X_3, Y_1, Z_3)$, respectively of three points A, B, C along the outer free end of the needle tip; determining the slopes $m_1$, $m_2$ of first and second sections of the needle using the spatial coordinates $(X_1, Y_1, Z_1)$, $(X_2, Y_1, Z_2)$, $(X_3, Y_1, Z_3)$, according to specific formulas; and, determining the tip angle using a further specific formula.

Accordingly, it is a primary objective of the present invention to provide a method of measuring the angle of each of a plurality of needle probes mounted on a probe card, in order to assure uniformity in probe tip angle.

Another object of the invention is to provide a method as described above which permits a determination of the tip angle after the probe card has been assembled and the test set up has been completed, therefore allowing detection of tip angle errors resulting from set up operations.

A still further object of the present invention is to provide a method as described above which can be carried out quickly and effectively by the operator of the test apparatus with minimal set up and checking time.

Another object of the invention is to provide a method as described above which employs simple, readily available equipment, such as a coordinate measuring machine, and simple calculation techniques for determining probe tip angle.

These, and further objects and advantages of the present invention, will be made clear or will become apparent during the course of the following description of a preferred embodiment of the invention.

BRIEF DESCRIPTION OF THE DRAWINGS

In the drawings, which are to be read in conjunction with the present description and appended claims, and were in like reference numerals are employed to designate identical components in the various views:

THE DESCRIPTION OF THE PREFERRED EMBODIMENTS

Figure 1:
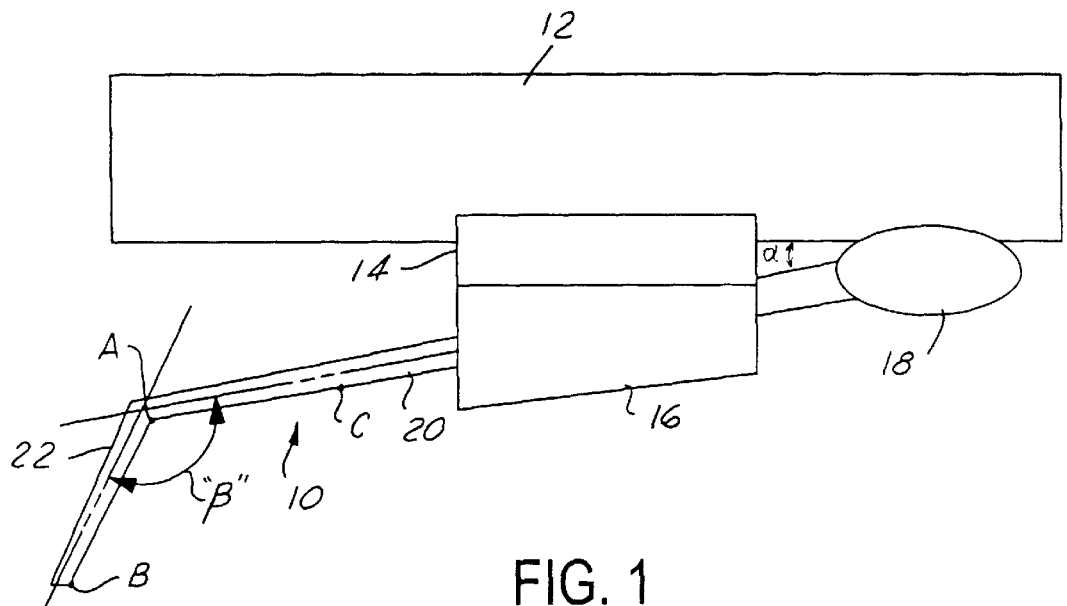
FIG. 1 is a cross sectional view taken through one side of a probe card, and showing a probe tip needle whose angle is to be measured in accordance with the method of the preferred embodiment of the invention.
Figure 2:
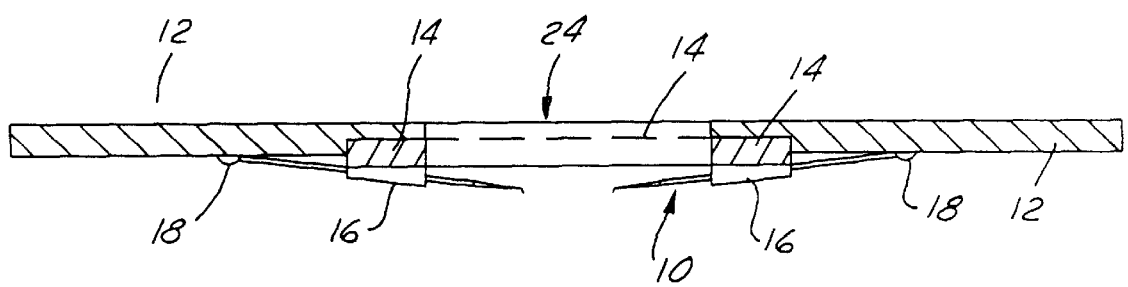
FIG. 2 is a cross sectional view of an entire probe card.
Figure 3:
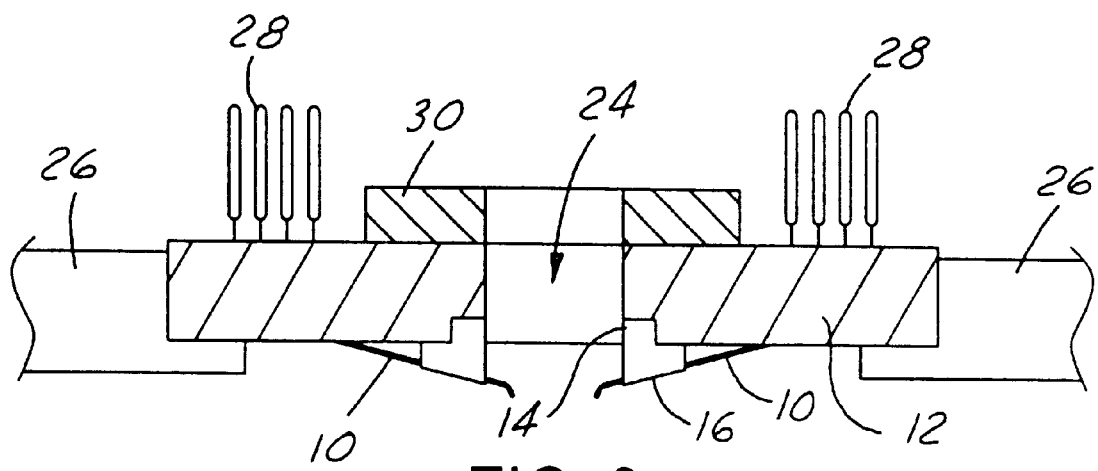
FIG. 3 is a fragmentary view showing the probe card mounted on a stage, and pressure pins for forcing the probe card toward an electrical device to be tested.

Referring now to FIGS. 1–4, inclusive, the present invention relates to a method of determining the angle of the outer tips of each of plurality of probe needles generally indicated by the numeral 10 which form part of a probe card employed to make electrical contact with and perform testing of microelectronic devices, such as integrated circuits (not shown). The probe card generally includes a planar board 12 having a central opening or cut-out 24 therein which is typically square or rectangular in shape. The board 12 may be formed of conventional printed circuit board materials, as well as other suitable materials which are electrically insulative. As best seen in FIG. 3, the probe card board 12 fits within and is supported on a stage 26 which is vertically movable relative to the electrical device (not shown) to be tested. The board 12 shown in FIG. 3 is provided with a stiffener 30 which is secured to the upper side of the board 12 and surrounds the opening 24. The stiffener 30 aids in reducing deflection of the board 12, and thus adds additional mechanical stability to the probe card. A plurality of "pogo" pins 28 mounted on a suitable driver (not shown) move downwardly to engage the top surface of the board 12 in a full contact, then the chuck of the prober which carries the electronic device moves upwardly to perform the probing.

A ring 14 of material is imbedded on the bottom side of the board 12, surrounding the opening 24. The ring 14 is formed of a material such an aluminum or ceramic to which epoxy may be bonded. The needles 10 are mounted on the ring 14 by means of a layer of 16 of epoxy material which is bonded to the ring 14. Each of the probe needles 10 includes a first leg 20 having its intermediate regions embedded within the epoxy ring 16, and a second leg forming a probe tip 22. The central axis of the leg 20 and that of the outer probe tip 22 form an angle " " relative to each other. The upper end of the leg 20 is provided with a solder connection 18 which allows electrical connection to test apparatus (not shown).

Figure 4:
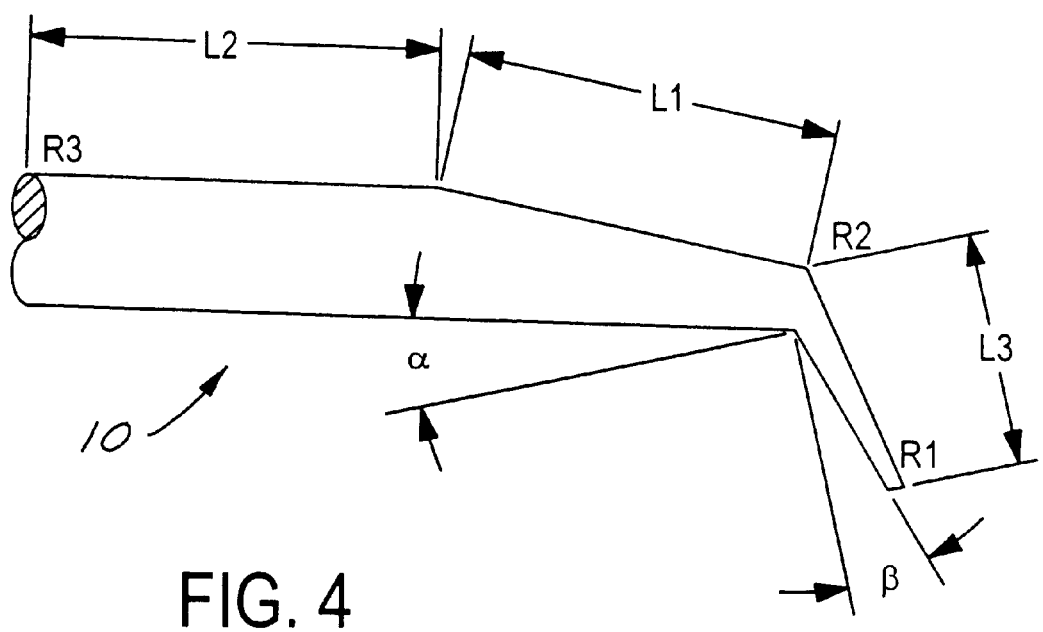
FIG. 4 is a fragmentary, side view of the outer end of one of the probe needles forming part of the probe card showing in FIG. 1–3.

As previously discussed, planarity of the probe card assembly, probe needle scrub and probe needle contact force are all critical parameters which must be closely controlled in order to assure repeatable and reliable testing. As shown in FIG. 4, parameters which contribute to or affect probe needle force include needle diameter R2, R3, tip diameter R1, beam length L1, L2, tip length L3, beam angle (d) and tip angle ($\beta$). Beam length L1, L2 has the most substantial influence on the contact force applied by the probe needle tip, and also highly influences the type of scrub mark left on the device pad. The beam angle (d) is the inner angle between main leg 20 and board 12 and is typically between 7 to 10 degrees, with a smaller angle resulting in less tip force. The needle tip angle ($\beta$) is preferably approximately 105 degrees ±2 degrees. It has been found that too steep of a tip angle, i.e., one reaching 100 degrees, results in failure to leave a scrub mark on a device pad, and thus it becomes necessary to overdrive the probe card assembly to achieve the desired probe marks, but the excessive probe force results in faster tip wear. Thus, precise control of the tip angle ($\beta$) results in precise alignment (planarity) of the needle tips 22 relative to the pads to be contacted and also results in the application of the proper amount of probe tip force which in turn produces scrub marks possessing the desired characteristics.

In order to achieve precise control over the probe tip angle, the probe tip angle is measured after the probe card is fully assembled and placed in the mounting stage 26. According to the present invention, a device such as a laser or common coordinate measuring machine (CMM—not shown) is used to measure at least three points along the length of each of the probe needles 10. In the case of a CMM, the probe tip thereof is first moved to a position where it contacts the probe needle tip at a first position "A" corresponding to the intersection of the axis of the outer tip 22 and the leg 20. At the first measurement position "A", the spatial coordinates $(X_1, Y_1, Z_1)$ are measured to produce a set of data A $(X_1, Y_1, Z_1)$. Next, the CMM probe is moved to a second position B corresponding to the outer reaches of the tip 22, where a second set of position data is recorded B $(X_2, Y_1, Z_2)$. Finally, the CMM probe is moved to position C at an intermediate section of the needle leg 20, where a third set of data is recorded C $(X_3, Y_1, Z_3)$. Position C may be essentially any point along the upper reaches of leg 20, between the bend point A and the epoxy ring 16.

Having thus recorded the above three dimensional position data, a first slope $m_1$ is calculated in according to the following formula:

$$m1 = \frac{Z_2 - Z_1}{X_2 - X_1}$$

In a similar manner, a second slope $m_2$ between points A and C is calculated according to the following formula:

$$m_2 = \frac{Z_3 - Z_1}{X_2 - X_1}$$

Finally, using simple triangulation techniques, the angle β may be calculated according to the following formula:

$$\beta = \frac{m_2 - m_2}{1 + m_1 m_2}$$

The foregoing measurements as well as the computations can be easily carried out using a PLC (programmable logic controller) and a set of programmed instructions.

It should be noted here that although a three point measurement technique has been described, the method of present invention can be carried out using a four point measurement which may yield, in some cases, even greater measurement accuracy. Further, the same technique may be employed, where necessary or desirable, to measure the angle β between the upper, main leg 20 of the needle, and the board 12.

From the foregoing, it is apparent that the present method provides for the reliable accomplishment of the objects of the invention, and does so in a very simple and reliable manner. It is recognized, of course, that those skilled in the art may make various modifications or additions to the preferred embodiment chosen to illustrate the present invention described above without departing from the spirit or scope of the present contribution to the art. Accordingly, it is to be understood that the protection sought and to be afforded hereby should be deemed to extend to the subject matter claimed and all equivalents thereof fairly within the scope of the invention.

What is claimed is:

1. A method of determining the angle of a probe needle tip used in a probe assembly for contacting and measuring electrical characteristics of a circuit device, wherein said needle tip includes first and second non-coaxial sections along the outer free end thereof, said method comprising the steps of:

(A) determining the spatial coordinates $(X_1, Y_1, Z_1)$, $(X_2, Y_1, Z_2)$, $(X_3, Y_1, Z_3)$, respectively of three points A, B, C along the outer free end of said needle tip;

(B) determining the slopes $m_1$, $m_2$ of said first and second sections using the spatial coordinates $(X_1, Y_1, Z_1)$, $(X_2, Y_1, Z_2)$, $(X_3, Y_1, Z_3)$, determined in step (A), according to the formulas:

$$m_1 = \frac{Z_2 - Z_1}{X_2 - X_1}$$

and $$m_2 = \frac{Z_3 - Z_1}{X_3 - X_1}, \text{ and;}$$

(C) determining said angle using the formula:

$$\text{tip angle} = \tan^{-1} m_2 - \frac{m_1}{1 + m_1 m_2}.$$

2. The method of claim 1, wherein Step (A) is performed by relatively moving said probe assembly and a position measuring probe, measuring said spatial coordinates $(X_1, Y_1, Z_1)$, $(X_2, Y_1, Z_2)$, $(X_3, Y_1, Z_3)$ at each of said points using said position measuring probe, and recording said spatial coordinates $(X_1, Y_1, Z_1)$, $(X_2, Y_1, Z_2)$, $(X_3, Y_1, Z_3)$.

3. The method of claim 1, including selecting said A point near the end of said tip within said first section, selecting said C point distal from said first point and within said section, and selecting said B point intermediate said A and C points.

4. The method of claim 1, wherein said measuring is carried out by contacting said needle tip at A, B and C points using a measuring probe.

5. The method of claim 4, wherein said measuring is performed by moving said probe to said B point, then to one of said A and C points, then to the other of said A and C points.

6. The method of claim 4, wherein said measuring is performed by moving said measuring probe relative to said probe needle between said A, B and C points.

* * * * *